(12) United States Patent
Tajima et al.

(10) Patent No.: US 8,004,324 B2
(45) Date of Patent: Aug. 23, 2011

(54) PHASE-LOCKED LOOP FREQUENCY SYNTHESIZER OF FRACTIONAL N-TYPE, AND PHASE SHIFT CIRCUIT WITH FREQUENCY CONVERTING FUNCTION

(75) Inventors: Kenichi Tajima, Tokyo (JP); Ryoji Hayashi, Tokyo (JP); Masafumi Nakane, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 335 days.

(21) Appl. No.: 12/159,327

(22) PCT Filed: Feb. 5, 2007

(86) PCT No.: PCT/JP2007/051912
§ 371 (c)(1),
(2), (4) Date: Jun. 26, 2008

(87) PCT Pub. No.: WO2007/091516
PCT Pub. Date: Aug. 16, 2007

(65) Prior Publication Data
US 2010/0171532 A1 Jul. 8, 2010

(30) Foreign Application Priority Data
Feb. 7, 2006 (JP) ................................ 2006-029947

(51) Int. Cl.
*H03L 7/06* (2006.01)
(52) U.S. Cl. ......... 327/156; 327/147; 327/163; 331/1 R; 331/18; 375/376
(58) Field of Classification Search .......... 327/105–107, 327/146–150, 155–159, 162, 163; 331/1 R, 331/16, 18, 25, 30, 34, 1 A; 375/373–376; 455/76
See application file for complete search history.

(56) References Cited

U.S. PATENT DOCUMENTS
4,965,531 A * 10/1990 Riley ............................ 331/1 A
(Continued)

FOREIGN PATENT DOCUMENTS
JP          10 93432      4/1998
(Continued)

OTHER PUBLICATIONS

Riley, Tom A. D. et al., "Delta-Sigma Modulation in Fractional-*N* Frequency Synthesis", IEEE Journal of Solid State Circuits, vol. 28, No. 5, pp. 553-559, (1993).
Office Action issued Jan. 25, 2011 in Japanese Patent Application No. 2007-557827.

*Primary Examiner* — Lincoln Donovan
*Assistant Examiner* — Patrick O'Neill
(74) *Attorney, Agent, or Firm* — Oblon, Spivak, McClelland, Maier & Neustadt, L.L.P.

(57) ABSTRACT

Provided is a phase-locked loop frequency synthesizer, including: a reference oscillator; a voltage controlled oscillator; a variable frequency divider that divides the high frequency signal in frequency to output a feedback signal; a phase comparator that compares the reference signal and the feedback signal with each other to output a phase comparison signal; a loop filter that outputs a control signal of the voltage controlled oscillator based on the phase comparison signal; and a frequency/phase control circuit that generates frequency division number control data in synchronism with any one of the feedback signal and the reference signal based on setting data which is input from an external to give an output frequency and setting data which is input from the external to give a phase to the reference signal, to thereby output the frequency division number control data to the variable frequency divider.

21 Claims, 11 Drawing Sheets

U.S. PATENT DOCUMENTS

| | | |
|---|---|---|
| 6,509,800 B2 | 1/2003 | Stockton |
| 6,708,026 B1 * | 3/2004 | Klemmer et al. .............. 455/314 |
| 6,919,744 B2 * | 7/2005 | Paist et al. ..................... 327/115 |
| 7,042,258 B2 * | 5/2006 | Booth et al. ................... 327/115 |
| 7,126,436 B1 * | 10/2006 | Li ................................. 332/127 |
| 7,253,692 B2 * | 8/2007 | Azuma ........................... 331/16 |
| 2005/0242851 A1 | 11/2005 | Booth et al. |

FOREIGN PATENT DOCUMENTS

| | | |
|---|---|---|
| JP | 2004 253902 | 9/2004 |
| JP | 2006 33414 | 2/2006 |

\* cited by examiner

FIG. 3A
FIG. 3B
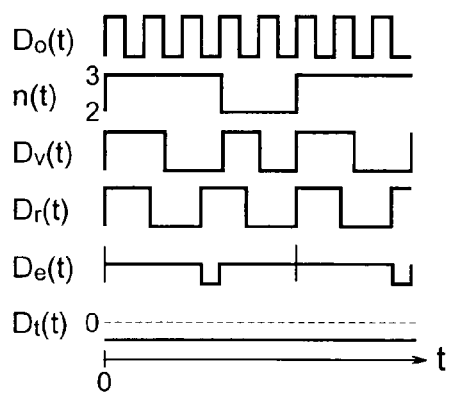
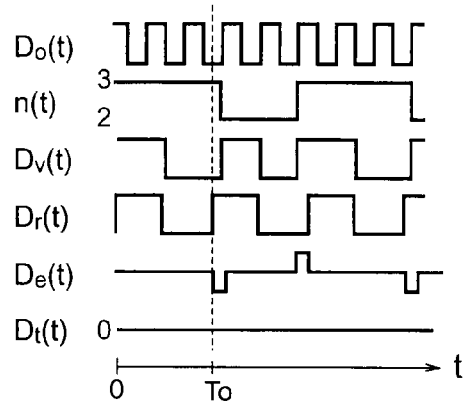
FIG. 4
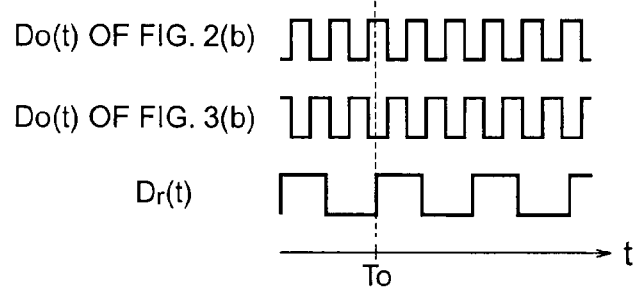

| ADDRESS OF MEMORY | | | | n'(t) | | n(t) | |
|---|---|---|---|---|---|---|---|
| $\theta$ | N | K | M | $D_1$ | $D_2$ | $R_1$ | $R_2$ |
| $\theta_1$ | 2 | 1 | 2 | 2 | 3 | 2 | 3 |
| $\theta_2$ | 2 | 1 | 2 | 3 | 2 | 3 | 2 |

| ADDRESS OF MEMORY | | | n'(t) | |
|---|---|---|---|---|
| N | K | M | $D_1$ | $D_2$ |
| 2 | 1 | 2 | 2 | 3 |

| SETTING DATA | n(t) | |
|---|---|---|
| $\theta$ | $R_1$ | $R_2$ |
| $\theta_1$ | 2 | 3 |
| $\theta_2$ | 3 | 2 |

FIG. 17
| ADDRESS OF MEMORY | p(t) | | |
|---|---|---|---|
| | $p_1$ | ... | $p_x$ |
| $\theta_1$ | 0 | ... | 1 |
| ... | 0 | ... | 0 |
| $\theta_x$ | 1 | ... | 0 |
FIG. 18
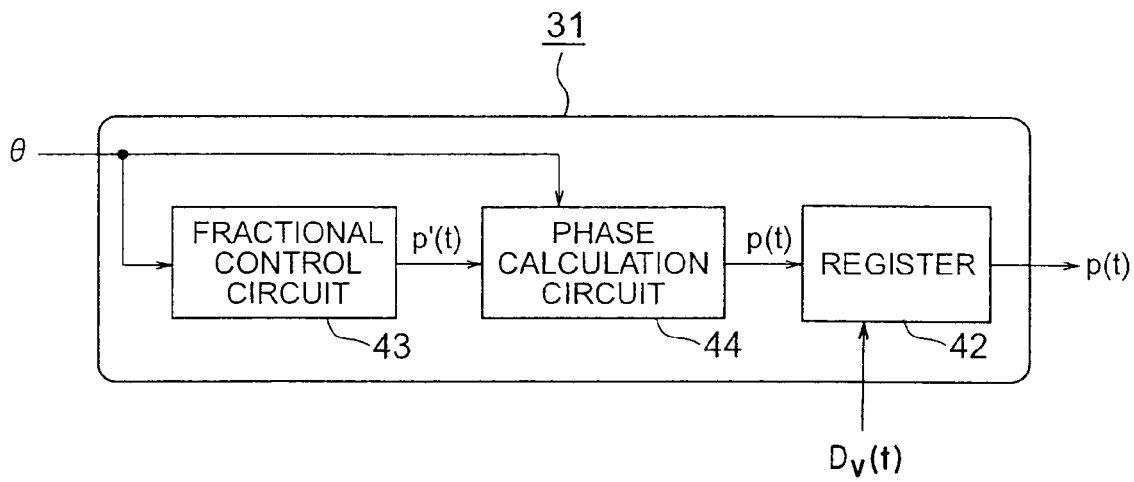
FIG. 19
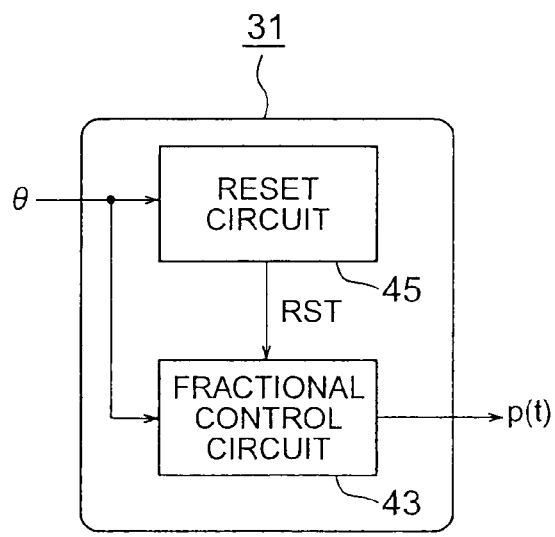

US 8,004,324 B2

PHASE-LOCKED LOOP FREQUENCY SYNTHESIZER OF FRACTIONAL N-TYPE, AND PHASE SHIFT CIRCUIT WITH FREQUENCY CONVERTING FUNCTION

TECHNICAL FIELD

The present invention relates to a phase-locked loop frequency synthesizer of the fractional N-type (hereinafter may be referred to as "F-PLL synthesizer") having a phase variable function of an output signal used in a radio communication device or the like, and a phase shift circuit with a frequency converting function having the F-PLL synthesizer.

BACKGROUND ART

A conventional F-PLL synthesizer will be described with reference to FIGS. 22 and 23 (for example, refer to Patent Document 1 and Non-patent Document 1). FIG. 22 is a diagram showing the configuration of the conventional F-PLL synthesizer. Also, FIG. 23 is a diagram showing the configuration of a fractional control circuit shown in FIG. 22.

Referring to FIG. 22, the conventional F-PLL synthesizer is made up of a reference oscillator (XO) 1 that generates a reference signal Dr(t), a voltage controlled oscillator (VCO) 4 that generates a high frequency signal $D_o(t)$, feedback circuits 5 and 6 that generate a feedback signal $D_v(t)$ according to a high frequency signal, a phase comparator (PD) 2 that receives the reference signal and the feedback signal as inputs, and a loop filter (LF) 3 that receives a phase comparison signal $D_e(t)$ which is an output of the phase comparator 2 as an input, and outputs a control signal $D_r(t)$ of the voltage controlled oscillator 4.

Also, the feedback circuit includes a variable frequency divider (FD) 5 that divides the frequency of a high frequency signal to output the feedback signal, and a fractional control circuit 6 that outputs, to the variable frequency divider 5, the control signal from the frequency divider according to setting data N, K, and M from an external in synchronism with the feedback signal. As shown in FIG. 23, the fractional control circuit 6 includes an adder circuit 11 (11a, 11b, 11c), a delay circuit 12 (12a, 12b), a 1-bit quantization circuit 13, and a multiplier circuit 14.

In the F-PLL synthesizer, the control signal of the frequency division has a cyclic property and fluctuates with a time, and a time average $n_{ave}$ of the control signal within one cycle is given by (N+K/M). Accordingly, the output frequency $f_o$ of the F-PLL synthesizer is represented by the following Expression (1).

$$f_o = f_r \cdot n_{ave} = f_r \cdot (N+K/M) \quad (1)$$

where $f_r$ is a phase comparison frequency, N is an integer portion of the frequency division number of the variable frequency divider 5, and K/M is a fractional portion of the frequency division number of the variable frequency divider 5 (for example, refer to Non-patent Document 1).

Patent Document 1: JP 05-500894 A
Non-patent Document 1: T. A. D. Riley, "Delta-Sigma Modulation in Fractional-N Frequency Synthesis" IEEE Journal of Solid State Circuits, Vol. 28, No. 5, MAY. 1993, pp. 553 to 559

DISCLOSURE OF THE INVENTION

Problem to be Solved by the Invention

In the conventional F-PLL synthesizer described above, the output frequency can be controlled by the setting data N, K, and M from the external. However, because there is no means for setting the phase of the output signal with respect to the reference signal, there arises such a problem that the control cannot be conducted.

The present invention has been made to solve the above problem, and an object of the present invention is to provide a phase-locked loop frequency synthesizer of the fractional N-type and a phase shift circuit with a frequency converting function, which are capable of controlling the phases of the output signal.

Means for Solving the Problem

According to the present invention, there is provided a phase-locked loop frequency synthesizer of a fractional N-type including: a reference oscillator that generates a reference signal; a voltage controlled oscillator that generates a high frequency signal; a variable frequency divider that divides the high frequency signal in frequency to output a feedback signal; a phase comparator that compares the reference signal and the feedback signal with each other to output a phase comparison signal; and a loop filter that outputs a control signal of the voltage controlled oscillator based on the phase comparison signal. Further, the phase-locked loop frequency synthesizer of a fractional N-type includes a frequency/phase control circuit that generates frequency division number control data in synchronism with any one of the feedback signal and the reference signal based on first setting data and second setting data to output the frequency division number control data to the variable frequency divider.

Effect of the Invention

The phase-locked loop frequency synthesizer of the fractional N-type according to the present invention produces the effect that the phase control of the output signal can be conducted.

BRIEF DESCRIPTION OF THE DRAWINGS

FIG. 3 Timing charts showing time waveforms immediately after the control of the phase-locked loop frequency synthesizer of the fractional N-type according to the first embodiment of the present invention starts and after the phase synchronization is established.

FIG. 4 A timing chart showing the time waveforms of an output signal after the phase synchronization of the phase-locked loop frequency synthesizer of the fractional N-type according to the first embodiment of the present invention is established.

FIG. 10 Diagrams showing an example of output data of a memory, a phase calculator circuit, and a register with respect to an address of the frequency/phase control circuit according to the third embodiment of the present invention.

FIG. 17 A diagram showing the configuration of a memory of the control pattern generation circuit shown in FIG. 16.

FIG. 18 A diagram showing the configuration of a control pattern generation circuit in a frequency/phase control circuit according to a ninth embodiment of the present invention.

FIG. 19 A diagram showing the configuration of a control pattern generation circuit in a frequency/phase control circuit according to a tenth embodiment of the present invention.

BEST MODE FOR CARRYING OUT THE INVENTION

First embodiment to eleventh embodiment of the present invention will be described below.

First Embodiment

Figure 1:
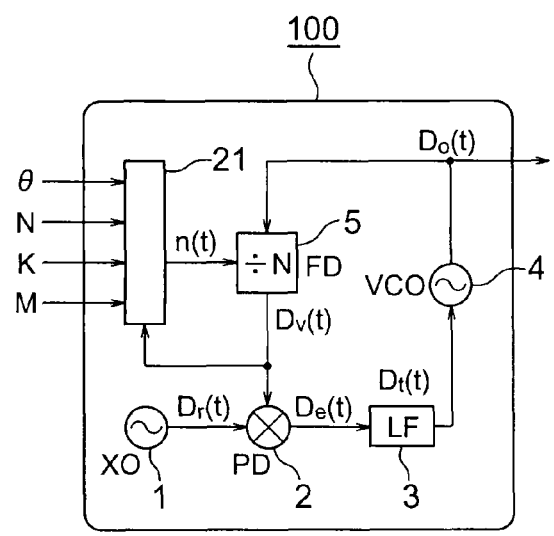
FIG. 1 A diagram showing the configuration of a phase-locked loop frequency synthesizer of a fractional N-type according to a first embodiment of the present invention.

A description will be given of a phase-locked loop frequency synthesizer of a fractional N-type according to a first embodiment of the present invention with reference to FIGS. 1 to 6. FIG. 1 is a diagram showing the configuration of the phase-locked loop frequency synthesizer of the fractional N-type according to the first embodiment of the present invention. In the following description, the same symbols indicate identical or corresponding parts in the respective drawings.

Referring to FIG. 1, an F-PLL synthesizer 100 according to the first embodiment includes a frequency/phase control circuit 21 that controls the frequency and phase of an output signal of the F-PLL synthesizer, a reference oscillator (XO) 1 that generates a reference signal, a voltage controlled oscillator (VCO) 4 that generates a high frequency signal, a variable frequency divider (FD) 5, a phase comparator (PD) 2 that receives a reference signal and a feedback signal as inputs, and a loop filter (LF) 3 that receives a phase comparison signal which is an output of the phase comparator 2 as an input to output a control signal of the voltage controlled oscillator 4.

Subsequently, a description will be given of the operation of the phase-locked loop frequency synthesizer of the fractional N-type according to the first embodiment with reference to the drawings.

Figure 5:
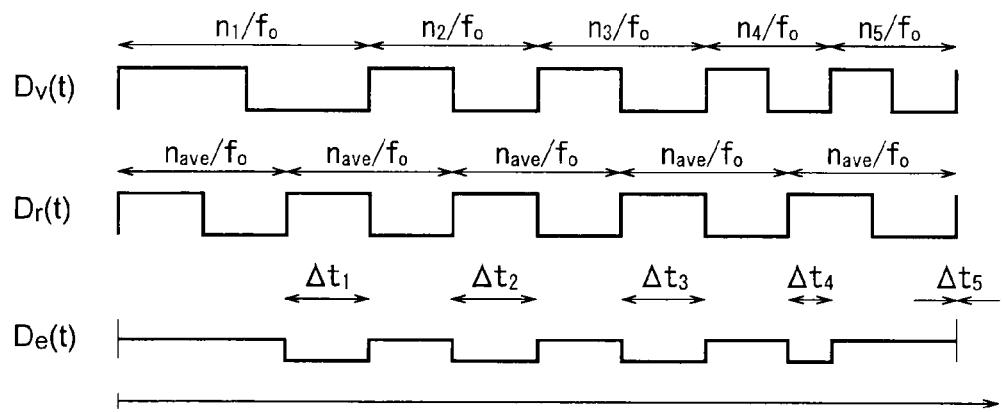
FIG. 5 A timing chart showing the phase quantity of an output signal with respect to a reference signal of the phase-locked loop frequency synthesizer of the fractional N-type according to the first embodiment of the present invention.
Figure 6:
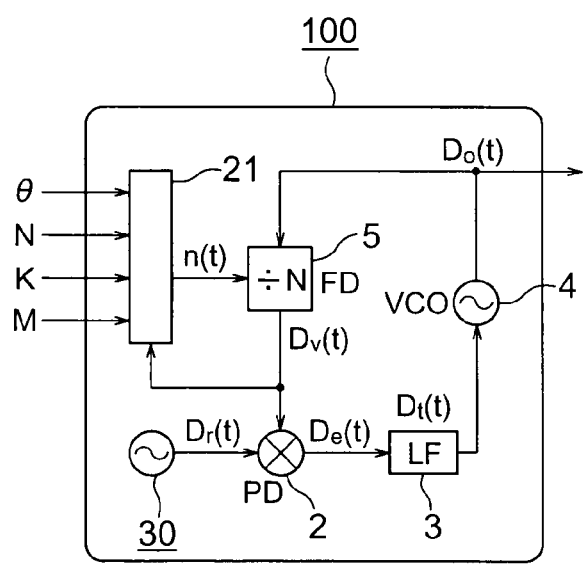
FIG. 6 A diagram showing another configuration of the phase-locked loop frequency synthesizer of the fractional N-type according to the first embodiment of the present invention.

FIGS. 2 and 3 are timing charts showing time waveforms immediately after the control of the phase-locked loop frequency synthesizer of the fractional N-type according to the first embodiment of the present invention starts and after the phase synchronization is established. Also, FIG. 4 is a timing chart showing time waveforms of an output signal after the phase synchronization of the phase-locked loop frequency synthesizer of the fractional N-type according to the first embodiment of the present invention is established. FIG. 5 is a timing chart showing the phase quantity of an output signal with respect to a reference signal of the phase-locked loop frequency synthesizer of the fractional N-type according to the first embodiment of the present invention. Further, FIG. 6 is a diagram showing another configuration of the phase-locked loop frequency synthesizer of the fractional N-type according to the first embodiment of the present invention.

Setting data N, K, and M that gives the output frequency of the F-PLL synthesizer 100 and setting data θ that gives the phase with respect to the reference signal are input from the external in advance. The frequency/phase control circuit 21 receives the setting data (N, K, M, θ) from the external as an input to output the frequency division number control data n(t) of the variable frequency divider 5 corresponding to the setting data to the variable frequency divider 5 in synchronism with an output signal of the variable frequency divider 5.

The variable frequency divider 5 receives the output signal of the voltage controlled oscillator 4 as an input to output the signal that has been divided in frequency according to the set frequency division number control data n(t) to the phase comparator 2 as the feedback signal and to the frequency/phase control circuit 21 as a clock signal, respectively.

The phase comparator 2 receives the output signal (feedback signal) of the variable frequency divider 5 and the output signal (reference signal) of the reference oscillator 1 as inputs to output a phase comparison signal to the loop filter 3. The loop filter 3 receives the phase comparison signal of the phase comparator 2 as an input to output a smoothed phase comparison signal to the voltage controlled oscillator 4. The voltage controlled oscillator 4 operates so that the frequencies of the reference signal and the feedback signal become equal to each other, and outputs the high frequency signal to the external of the F-PLL synthesizer 100 and the variable frequency divider 5, respectively.

The operation of the frequency/phase control circuit 21 will be described. The frequency/phase control circuit 21 obtains a pattern of n(t) in which a time average $n_{ave}$ of n(t) per cycle becomes (N+K/M) from the setting data N, K, and M. In this example, it is assumed that N=2, K=1, and M=2, and 2 and 3 are repeated such as n(t)=2, 3, 2, 3, . . . as a pattern.

Figure 2A:
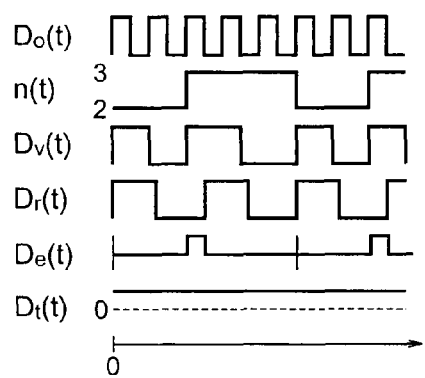
FIG. 2 Timing charts showing time waveforms immediately after the control of the phase-locked loop frequency synthesizer of the fractional N-type according to the first embodiment of the present invention starts and after the phase synchronization is established.

FIG. 2 show time waveforms when start data of n(t) at a time (t)=0 is 2. As shown in FIG. 2(a), because the phase comparison signal $D_e(t)$ of the phase comparator 2 is only a pulse of a positive amplitude immediately after the control starts, the output signal $D_f(t)$ of the loop filter 3 is a positive voltage. In the case where the DC gain of the loop filter 3 is sufficiently high, the F-PLL synthesizer 100 operates so that $D_f(t)$ becomes substantially zero to establish the phase synchronization.

FIG. 3 show time waveforms when the start data of n(t) at a time (t)=0 is 3. As shown in FIG. 3(a), because the phase comparison signal $D_e(t)$ of the phase comparator 2 is only a pulse of a negative amplitude immediately after the control starts, the output signal $D_f(t)$ of the loop filter 3 is a negative voltage. In the case where the DC gain of the loop filter 3 is sufficiently high, the F-PLL synthesizer 100 operates so that $D_f(t)$ becomes substantially zero to establish the phase synchronization.

Figure 2B:
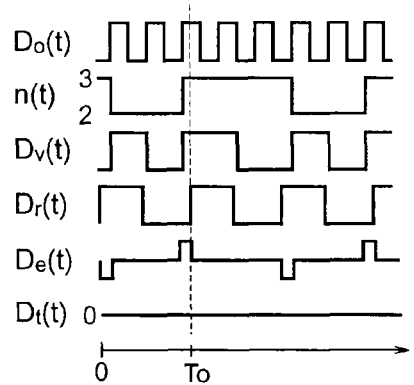

When the free running frequency of the voltage controlled oscillator 4 before the control starts is identical with each other, a time for establishing the phase synchronization is identical with each other not depending on the start data of n(t). FIG. 4 shows a time waveform of an output signal $D_o(t)$ with respect to a reference signal $D_r(t)$ at a time $T_o$ after the phase synchronization is established. In FIG. 4, the time waveforms after the phase synchronization is established in FIGS. 2(b) and 3(b) are compared with each other. It is found from FIG. 4 that the phase of the output signal $D_o(t)$ at the time $T_o$ is different from each other. That is, the start data of n(t) is controlled, thereby enabling the phase of the output signal of the F-PLL synthesizer 100 to be controlled.

Now, a description will be given of the phase quantity of the output signal $D_o(t)$ with respect to the reference signal $D_r(t)$ with reference to FIG. 5. In this example, a total value of the widths of the rectangular waves of the phase comparison signal $D_e(t)$ is obtained in the case where the reference signal $D_r(t)$ and the feedback signal $D_v(t)$ rise up at the same time to calculate the phase quantity on the basis of the total value. It is assumed that the patterns of n(t) is $n_1, n_2, n_3, \ldots$, and M data exists in one cycle. The phase comparison signal $D_e(t)$ is obtained according to the rising time of the reference signal $D_r(t)$ and the feedback signal $D_v(t)$. In the description, when the reference signal $D_r(t)$ rises earlier than the feedback signal $D_r(t)$, the phase comparison signal $D_e(t)$ becomes a negative rectangular wave, and in a reverse case, the phase comparison signal $D_e(t)$ becomes a positive rectangular wave. When the reference signal $D_r(t)$ and the feedback signal $D_v(t)$ rise at the same time, the phase comparison signal becomes the rectangular wave of the width 0. The width $\Delta t_i$ of the rectangular wave after the pattern data $n_i$ of n(t) is represented by the following Expression (2).

$$\Delta t_i = (n_1 + \ldots + n_i)/f_o - i \cdot n_{ave}/f_o \quad (2)$$

The total value $\Delta t_{sum}$ is represented by the following Expression (3) from Expression (2).

$$\Delta t_{sum} = \Delta t_1 + \ldots + \Delta t_M = (M \cdot n_1 + (M-1) \cdot n_2 + \ldots n_M)/f_o - 0.5M \cdot (M+1) \cdot n_{ave}/f_o \quad (3)$$

In order to establish the phase synchronization, it is necessary that $\Delta t_{sum}$ converge to $\Delta t_x$ which becomes a desired control voltage of the voltage controlled oscillator 4. In general, because the DC gain of the loop filter 3 is sufficiently high, $\Delta t_x$ becomes substantially zero. In order to set $\Delta t_{sum}$ to 0, it is necessary to shift the widths of the respective rectangular waveforms by $t_{offset}$. The $t_{offset}$ is represented by the following Expression (4).

$$t_{offset} = \Delta t_{sum}/M \quad (4)$$

The feedback signal $D_v(t)$ is shifted from the reference signal $D_r(t)$ by $t_{offset}$ with the result that $\Delta t_{sum}$ converges to 0 to establish the phase synchronization. Since the feedback signal $D_v(t)$ and the output signal $D_o(t)$ operate in phase synchronization, the phase of the output signal $D_o(t)$ changes from the reference signal $D_r(t)$ by $(2\pi f_o \cdot t_{offset})$ (rad).

In this example, the description has been given assuming that the pattern of n(t) whose $n_{ave}$ is 2.5 repeats 2 and 3. A desired output frequency ($f_o$) can be obtained even in another data pattern (for example, 1, 4, 2, and 3 are repeated such as 1, 4, 2, 3, 1, 4, 2, 3, . . . ) of n(t) whose $n_{ave}$ become identical through Expression (1) to Expression (4), and the phase of the output signal can be controlled. That is, even if the contents of data and the pattern cycle are different in each of the phase setting data, n(t) has the same advantage when the time average per cycle is identical.

Through Expression (2) to Expression (4), the F-PLL synthesizer according to this embodiment does not depend on the frequency ($f_r$) of the output signal of the reference oscillator 1. Hence, as shown in FIG. 6, the same advantage is obtained even in a frequency synthesizer 30 that can change the frequency of the output signal. The frequency synthesizer 30 can be constituted by the combination of a PLL frequency synthesizer with a direct digital synthesizer.

In the above description, the frequency/phase control circuit 21 operates in synchronism with the output signal of the variable frequency divider 5. Because the phase relationship between the output signal of the variable frequency divider 5 after the phase synchronization is established and the reference signal is constant, even if the frequency/phase control circuit 21 operates in synchronism with the reference signal of the reference oscillator (XO) 1, the same advantage is obtained.

Second Embodiment

Figures 7, 8:
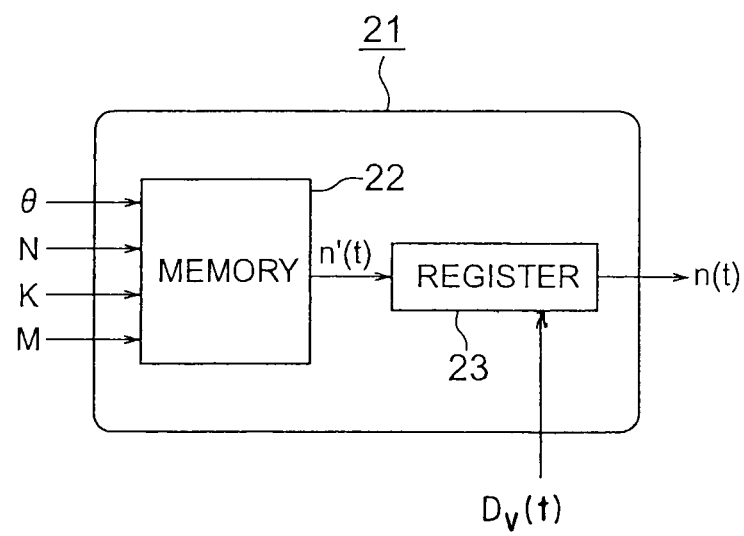
FIG. 7 A diagram showing the configuration of a frequency/phase control circuit according to a second embodiment of the present invention.
FIG. 8 A diagram showing an example of output data of a memory and a register with respect to an address of the frequency/phase control circuit according to the second embodiment of the present invention.

A description will be given of a frequency/phase control circuit according to a second embodiment of the present invention with reference to FIGS. 7 and 8. FIG. 7 is a diagram showing the configuration of the frequency/phase control circuit according to the second embodiment of the present invention. Also, FIG. 8 is a diagram showing an example of output data of a memory and a register with respect to an address of the frequency/phase control circuit according to the second embodiment of the present invention. The configurations other than the frequency/phase control circuit are identical with those in the first embodiment.

Referring to FIG. 7, a frequency/phase control circuit 21 according to the second embodiment includes a memory 22 and a register 23.

In the above first embodiment, the phase of the output signal of the F-PLL synthesizer 100 can be controlled by the pattern of the frequency division number control data n(t) of the variable frequency divider 5. In the second embodiment, one technique of the frequency/phase control circuit 21 will be described.

The frequency/phase control circuit 21 shown in FIG. 7 includes the memory 22 and the register 23 as described above. The memory 22 receives the setting data (N, K, M, θ) from the external as the address of the memory 22 as an input to output the pattern n'(t) of n(t) corresponding to the address to the register 23.

The register 23 holds the input n'(t) within the register 23, and outputs the data that has been held in synchronism with the output signal $D_v(t)$ of the variable frequency divider 5 to the variable frequency divider 5 from a first address of the register 23 as n(t). Then, after the register 23 outputs the data of a last address, the register 23 returns to the first address and repetitively outputs the data.

As shown in FIG. 8, the pattern of n(t) corresponding to the setting data (N, K, M, θ) is held in the memory 22 in advance, thereby making it possible to generate the output signal of a desired frequency, and to conduct the phase control.

Third Embodiment

Figures 9, 10A, 10B:
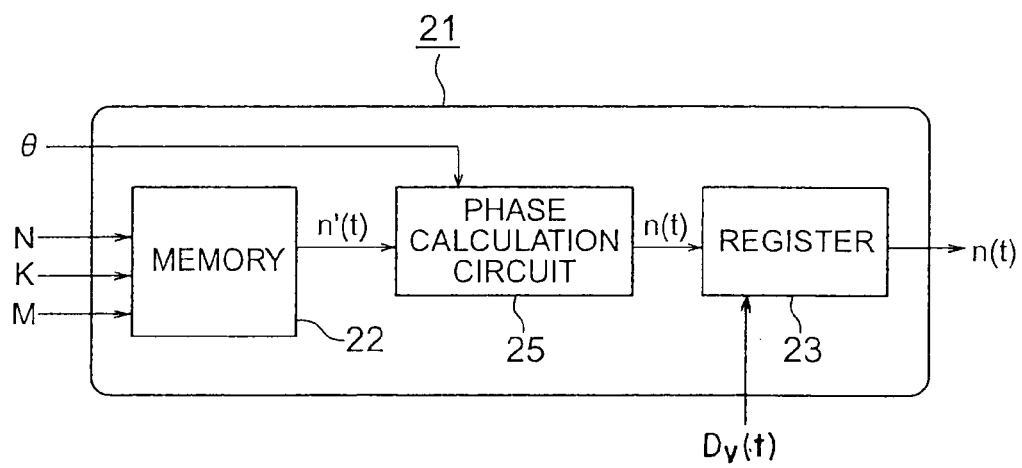
FIG. 9 A diagram showing the configuration of a frequency/phase control circuit according to a third embodiment of the present invention.

A description will be given of a frequency/phase control circuit according to a third embodiment of the present invention with reference to FIGS. 9 and 10. FIG. 9 is a diagram showing the configuration of the frequency/phase control circuit according to the third embodiment of the present invention. Also, FIG. 10 are diagrams showing an example of output data of a memory, a phase calculation circuit, and a register with respect to an address of the frequency/phase control circuit according to the third embodiment of the present invention. The configurations other than the frequency/phase control circuit are identical with those in the first embodiment.

Referring to FIG. 9, a frequency/phase control circuit 21 according to the third embodiment includes a memory 22, a phase calculation circuit 25, and a register 23.

In the above second embodiment, one technique of the frequency/phase control circuit 21 was described. In order to generate the output signal of a desired frequency and enable the phase control, the pattern of n(t) corresponding to the setting data (N, K, M, θ) is stored in the memory 22 in advance. However, there arises such a problem that the capacity of the memory 22 increases with an increase in the frequency and the resolution of phase. In the third embodiment, a technique by which the capacity of the memory 22 can be reduced more than that in the above second embodiment will be described.

The frequency/phase control circuit 21 shown in FIG. 9 includes the memory 22, the phase calculation circuit 25, and the register 23 as described above. The memory 22 receives the setting data (N, K, M, θ) from the external as the address of the memory 22 as an input to output the pattern n'(t) of n(t) corresponding to the address to the phase calculation circuit 25.

The phase calculation circuit 25 receives the setting data (θ) from the external and n'(t) from the memory 22 as inputs to output n(t) corresponding to θ to the register 23. The register 23 holds the input n(t) within the register 23, and outputs the data that has been held in synchronism with the output signal $D_v(t)$ of the variable frequency divider 5 to the variable frequency divider 5 from a first address of the register 23 as n(t). Then, after the register 23 outputs the data of a last address, the register 23 returns to the first address and repetitively outputs the data.

The phase calculation circuit 25 calculates the phase quantity obtained by n'(t) by the aid of Expression (2) to Expression (4). When the number of pattern data of n'(n) is M, the phase calculation circuit 25 conducts the calculation M times while changing the start data to obtain start data $n_x$ corresponding to θ. Then, the phase calculation circuit 25 changes the pattern of n'(t) to a pattern starting from $n_x$ to output the pattern to the register 23 as n(t).

FIGS. 10(a) and 10(b) show an example of the output data from the memory 22 with respect to the address and the output data from the phase calculation circuit 25 and the register 23. As shown in FIG. 10(a), only the pattern of n(t) corresponding to the setting data (N, K, M) is stored in the memory 22. For that reason, the capacity of the memory 22 does not increase even if the resolution of θ is increased. That is, the memory 22 of the frequency/phase control circuit 21 described in the third embodiment can reduce the capacity more than in the second embodiment.

Fourth Embodiment

Figure 11:
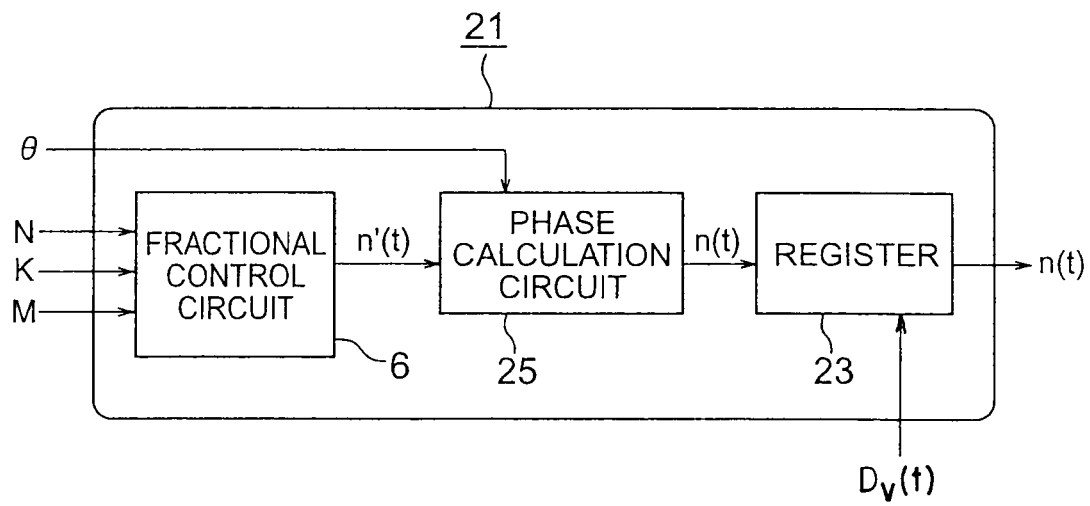
FIG. 11 A diagram showing the configuration of a frequency/phase control circuit according to a fourth embodiment of the present invention.

A description will be given of a frequency/phase control circuit according to a fourth embodiment of the present invention with reference to FIG. 11. FIG. 11 is a diagram showing the configuration of the frequency/phase control circuit according to the fourth embodiment of the present invention. The configurations other than the frequency/phase control circuit are identical with those in the first embodiment.

In the above second and third embodiments, the techniques of the frequency/phase control circuit 21 were described. Those techniques suffer from such a problem that the capacity of the memory 22 increases with an increase in the frequency and the resolution of phase. In the fourth embodiment, a technique of controlling the frequency and phase of the output signal without using the memory will be described.

The frequency/phase control circuit 21 shown in FIG. 11 includes a fractional control circuit 6, a phase calculation circuit 25, and the register 23. The fractional control circuit 6 receives the setting data (N, K, M) from the external as an input to output the pattern n'(t) of n(t) corresponding to the setting data to the phase calculation circuit 25.

The phase calculation circuit 25 receives the setting data (θ) from the external and n'(t) from the fractional control circuit 6 as inputs to output n(t) corresponding to θ to the register 23. The register 23 holds the input n(t) within the register 23, and outputs the data that has been held in synchronism with the output signal $D_v(t)$ of the variable frequency divider 5 to the variable frequency divider 5 from a first address of the register 23 as n(t). Then, after the register 23 outputs the data of a last address, the register 23 returns to the first address and repetitively outputs the data.

In the frequency/phase control circuit 21 described in the fourth embodiment, the pattern of n'(t) corresponding to the setting data (N, K, M) is generated by the fractional control circuit 6 without using the memory. The calculation quantity of the phase calculation circuit 25 increases with an increase in the frequency and the resolution of the phase, but the frequency and the phase can be controlled.

Fifth Embodiment

Figure 12:
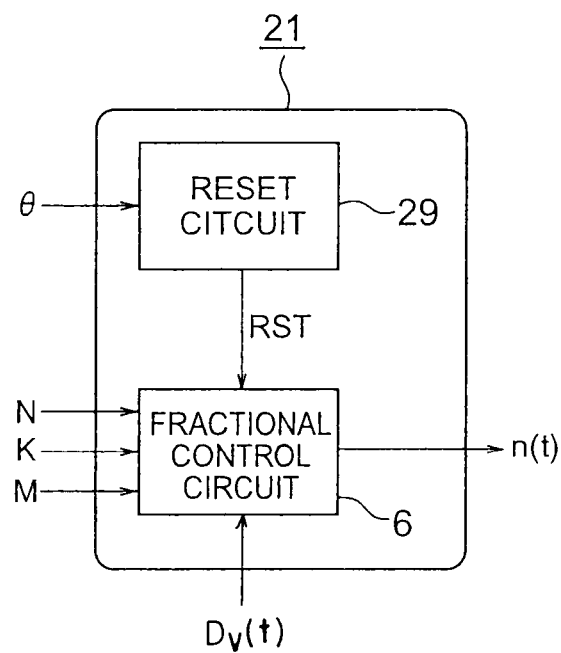
FIG. 12 A diagram showing the configuration of a frequency/phase control circuit according to a fifth embodiment of the present invention.

A description will be given of a frequency/phase control circuit according to a fifth embodiment of the present invention with reference to FIGS. 12 and 13. FIG. 12 is a diagram showing the configuration of the frequency/phase control circuit according to the fifth embodiment of the present invention. FIG. 13 are timing charts showing a relationship between a reset signal (RST) and n(t) of the frequency/phase control circuit according to the fifth embodiment of the present invention. The configurations other than the frequency/phase control circuit are identical with those in the first embodiment.

In the above second to fourth embodiments, the techniques of the frequency/phase control circuit 21 were described. In the fifth embodiment, another technique of controlling the frequency and phase of the output signal will be described.

The frequency/phase control circuit 21 shown in FIG. 12 includes a fractional control circuit 6 and a reset circuit 29. The reset circuit 29 receives the setting data 8 from the external as an input to output a reset signal (RST) to the fractional control circuit 6 at a timing corresponding to θ.

The fractional control circuit 6 receives the reset signal (RST) from the reset circuit 29 and the setting data (N, K, M) from the external as inputs to output n(t) corresponding to the setting data to the variable frequency divider 5 in synchronism with the output signal $D_v(t)$ of the variable frequency divider 5 at a timing corresponding to the reset signal.

Figure 13A:
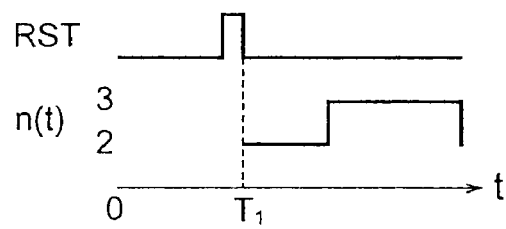
FIG. 13 Timing charts showing a relationship between a reset signal (RST) and n(t) of the frequency/phase control circuit according to the fifth embodiment of the present invention.
Figure 13B:
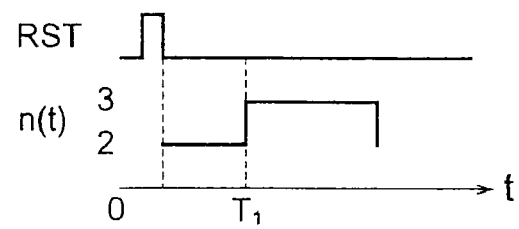

FIGS. 13(a) and 13(b) show a relationship of the reset signal (RST) and n(t). FIG. 13(a) shows a case in which n(t) at a time $T_1$ is 2, and FIG. 13(b) shows a case in which n(t) at a time $T_1$ is 3. In this example, it is assumed that the fractional control circuit 6 that has been reset repeats 2 and 3 such as 2, 3, 2, 3, ... as a pattern. When n(t) starts from 2 at the time $T_1$, the reset signal (RST) is input to the fractional control circuit 6 immediately before $T_1$. On the other hand, when n(t) starts from 3 at the time $T_1$, the reset signal (RST) is input to the fractional control circuit 6 as early as a time when n(t) is 2. As a result, the fractional control circuit 6 starts to operate before the time $T_1$, and n(t) becomes 3 at the time $T_1$.

The timing of resetting the fractional control circuit 6 is controlled, thereby enabling the phase of the output signal of the F-PLL synthesizer 100 to be controlled.

Sixth Embodiment

Figure 14:
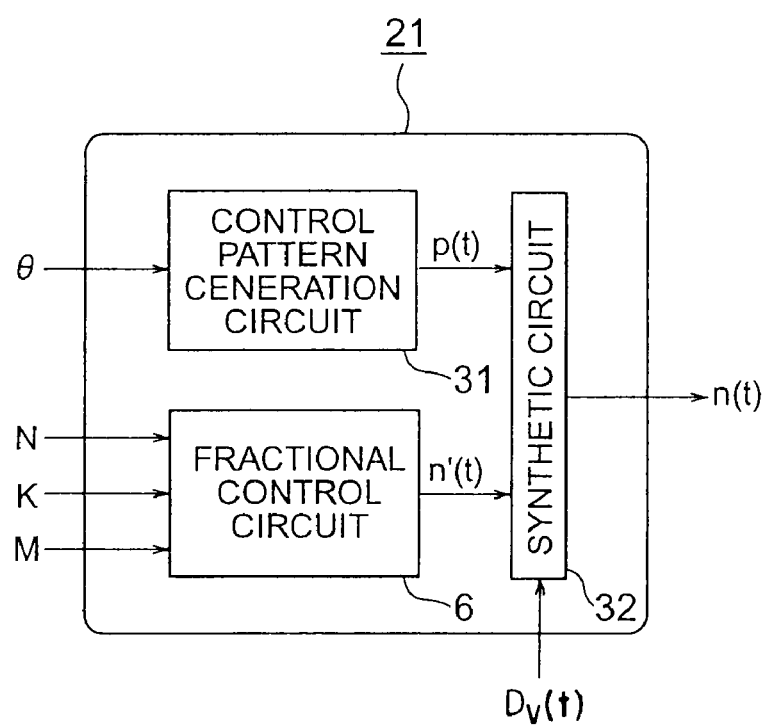
FIG. 14 A diagram showing the configuration of a frequency/phase control circuit according to a sixth embodiment of the present invention.

A description will be given of a frequency/phase control circuit according to a sixth embodiment of the present invention with reference to FIG. 14. FIG. 14 is a diagram showing the configuration of the frequency/phase control circuit according to the sixth embodiment of the present invention. The configurations other than the frequency/phase control circuit are identical with those in the first embodiment.

The frequency/phase control circuit 21 shown in FIG. 14 is made up of a fractional control circuit 6, a control pattern generation circuit 31, and a synthetic circuit 32.

Figure 23:
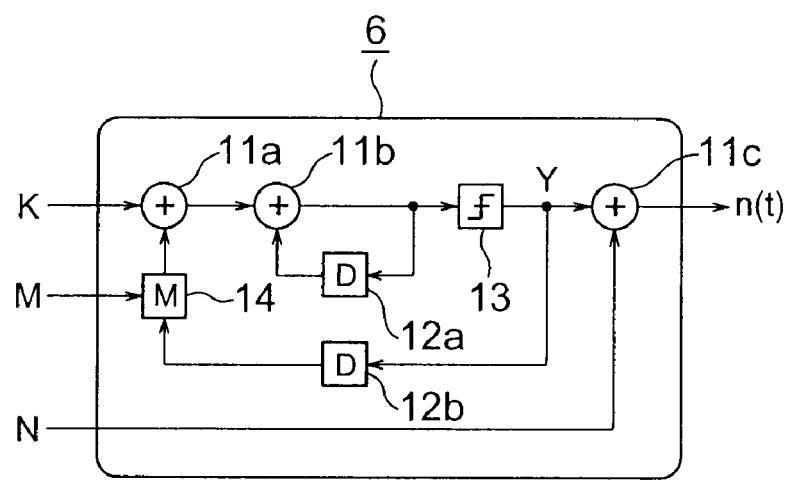
FIG. 23 A diagram showing the configuration of a fractional control circuit shown in FIG. 22.

In the above fourth and fifth embodiments, a technique of generating n(t) by the aid of the fractional control circuit 6 was described. A pattern length X of n(t) is given by a function of K and M, and the longest one is $\alpha \cdot M$ ($\alpha$ is a natural number). The number $\alpha$ is different depending on the fractional control circuit 6, and $\alpha$ is 1 in the fractional control circuit 6 shown in FIG. 23. Because the phase resolution $\Delta\theta$ of the output signal is $2\pi \cdot 360/X$(rad), a desired $\Delta\theta$ cannot be obtained by K and M. In this example, one technique of the frequency/phase control circuit 21 by which the desired $\Delta\theta$ can be obtained will be described.

The control pattern generation circuit 31 receives the setting data ($\theta$) from the external as an input to output a control pattern p(t) corresponding to $\theta$ to the synthetic circuit 32. The fractional control circuit 6 receives the setting data (N, K, M) from the external as an input to output a control pattern n'(t) corresponding to the setting data to the synthetic circuit 32. The synthetic circuit 32 adds or subtracts p(t) and n'(t), and outputs the synthesized control pattern n(t) to the variable frequency divider 5 in synchronism with the output signal $D_v(t)$ of the variable frequency divider 5.

When it is assumed that the pattern length of p(t) is Y, Y that can obtain the desired $\Delta\theta$ regardless of X needs to satisfy the following Expression.

$$Y \geq int(2\pi \cdot 360/\Delta\theta) \quad (5)$$

A pattern length Z of the synthesized n(t) is the lowest common multiple of X and Y, and $\Delta\theta$ is $2\pi \cdot 360/Z$(rad). The p(t) and n'(t) of Y that satisfies Expression (5) are synthesized to make Z sufficiently longer than X, thereby making it possible to obtain a desired $\Delta\theta$.

The output frequency $f_o$ of the F-PLL synthesizer in the case of using the synthesized n(t) is represented by the following Expression. In the Expressions (6) and (7), $p_{ave}$ is a time average value of p(t).

$$f_o = f_r \cdot (n_{ave} + p_{ave}) \text{ (a case of } n'(t) + p(t)) \quad (6)$$

$$f_o = f_r \cdot (n_{ave} - p_{ave}) \text{ (a case of } n'(t) - p(t)) \quad (7)$$

In the frequency/phase control circuit 21 described in the sixth embodiment, the control pattern generation circuit 31 and the synthetic circuit 32 are newly provided so as to obtain the desired $\Delta\theta$ regardless of the setting data (N, K, M) of the fractional control circuit 6.

Seventh Embodiment

Figure 15:
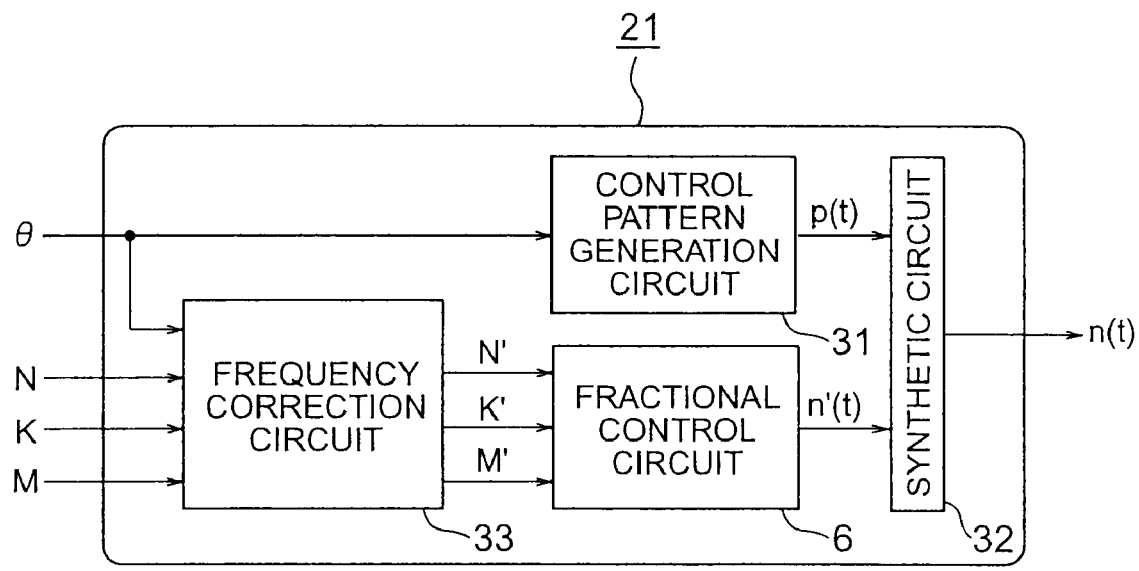
FIG. 15 A diagram showing the configuration of a frequency/phase control circuit according to a seventh embodiment of the present invention.

A description will be given of a frequency/phase control circuit according to a seventh embodiment of the present invention with reference to FIG. 15. FIG. 15 is a diagram showing the configuration of the frequency/phase control circuit according to the seventh embodiment of the present invention. The configurations other than the frequency/phase control circuit are identical with those in the first embodiment.

With the use of the synthesized n(t) through Expressions (6) and (7), the output frequency $f_o$ of the F-PLL synthesizer is a value shifted by $f_r \cdot (p_{ave})$ as compared with Expression (1). In this example, a description will be given of a technique of correcting the frequency shift attributable to the synthesis of the control pattern.

The frequency/phase control circuit 21 shown in FIG. 15 is configured so as to add a frequency correction circuit 33 to the frequency/phase control circuit 21 shown in FIG. 14. The frequency correction circuit 33 receives the setting data (N, K, M) and the setting data ($\theta$) as inputs to output the setting data (N', K', M') that has been subjected to $f_r \cdot (p_{ave})$ frequency division number correction to the fractional control circuit 6.

The frequency corrected setting data (N', K', M') is set so as to satisfy the following Expression.

$$N' + K'/M' = N + K/M - p_{ave}(\text{a case of } n'(t) + p(t)) \quad (8)$$

$$N' + K'/M' = N + K/M + p_{ave} \text{ (a case of } n'(t) - p(t)) \quad (9)$$

The n'(t) is generated by the aid of the frequency corrected setting data (N', K', M'), and then synthesized with p(t) to obtain the frequency corrected n(t). As a result, a desired $f_o$ and $\Delta\theta$ can be controlled.

Eighth Embodiment

Figure 16:
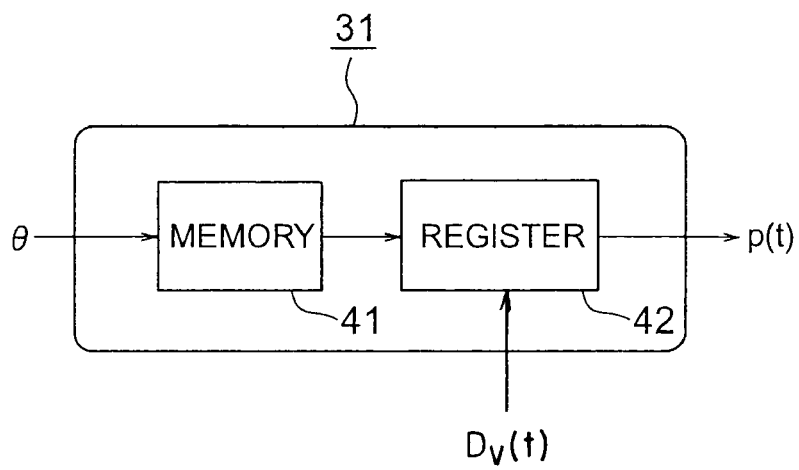
FIG. 16 A diagram showing the configuration of a control pattern generation circuit in a frequency/phase control circuit according to an eighth embodiment of the present invention.

A description will be given of a control pattern generation circuit of a frequency/phase control circuit according to a eighth embodiment of the present invention with reference to FIGS. 16 and 17. FIG. 16 is a diagram showing the configuration of the control pattern generation circuit of the frequency/phase control circuit according to the seventh embodiment of the present invention. The configurations other than the frequency/phase control circuit are identical with those in the first embodiment.

In the above sixth and seventh embodiments, p(t) that is an output of the control pattern generation circuit 31 is synthesized with n'(t) that is an output of the fractional control circuit 6 to obtain the desired $\Delta\theta$. In the eighth embodiment, a technique of the control pattern generation circuit 31 will be described.

The control pattern generation circuit 31 shown in FIG. 16 is made up of a memory 41 and a register 42. The memory 41 receives as an input the setting data ($\theta$) as an address of the memory to output a pattern p(t) corresponding to the address to the register 42. The register 42 holds the input p(t) within the register 42, and outputs the data that has been held in synchronism with the output signal $D_v(t)$ of the variable frequency divider 5 to the synthetic circuit 32 from a first address of the register. Then, after the register 42 outputs the data of a last address at which the data is stored, the register 42 returns to the first address and repetitively outputs the data.

FIG. 17 shows an example of the output data of the memory 41 with respect to the address and the output data of the register. As shown in FIG. 17, a pattern of p(t) corresponding to θ is stored in the memory in advance, thereby making it possible to conduct an arbitrary phase control.

Ninth Embodiment

A description will be given of a control pattern generation circuit of a frequency/phase control circuit according to a ninth embodiment of the present invention with reference to FIG. 18. FIG. 18 is a diagram showing the configuration of the control pattern generation circuit of the frequency/phase control circuit according to the ninth embodiment of the present invention. The configurations other than the frequency/phase control circuit are identical with those in the first embodiment.

In the above eighth embodiment, a technique of the control pattern generation circuit 31 was described. A pattern of p(t) corresponding to the setting data 8 is stored in the memory in advance. However, because the pattern length of p(t) corresponding to θ is extended with an increase in Δθ, there arises such a problem that the capacity of the memory 41 increases. In this example, a technique of the control pattern generation circuit 31 without using the memory 41 will be described.

The control pattern generation circuit 31 shown in FIG. 18 is made up of a fractional control circuit 43, a phase calculation circuit 44, and a register 42. The fractional control circuit 43 receives the setting data (θ) as an input to output data for one cycle of the control pattern p'(t) corresponding to θ to the phase calculation circuit 44. The phase calculation circuit 44 receives θ and p'(t) as inputs to output p(t) corresponding to θ to the register 42. The register 42 holds the input p(t) within the register 42, and outputs the data that has been held in synchronism with the output signal $D_v(t)$ of the variable frequency divider 5 to the synthetic circuit 32 from a first address of the register 42. Then, after the register 42 outputs the data of a last address at which the data is stored, the register 42 returns to the first address and repetitively outputs the data.

The phase calculation circuit 44 calculates the phase quantity that is obtained by p(t) by the aid of Expression (2) to Expression (4). When the number of data for one cycle of the control pattern p'(t) is X, the phase calculation circuit 44 conducts the calculation X times while shifting the start data of p'(t) one by one, and obtains p(t) corresponding to θ to output p(t) to the register 42.

In the control pattern generation circuit 31 described in the ninth embodiment, p'(t) corresponding to θ is generated by the fractional control circuit 43. The calculation quantity of the phase calculation circuit 44 increases with an increase in the resolution of the phase, but the phase can be controlled without using the memory.

Tenth Embodiment

A description will be given of a control pattern generation circuit of a frequency/phase control circuit according to a tenth embodiment of the present invention with reference to FIGS. 19 and 20. FIG. 19 is a diagram showing the configuration of the control pattern generation circuit of the frequency/phase control circuit according to the tenth embodiment of the present invention. The configurations other than the frequency/phase control circuit are identical with those in the first embodiment.

In the above eighth and ninth embodiments, the techniques of the control pattern generation circuit 31 using the register were described. The pattern of p(t) corresponding to θ is temporarily stored in the register, and is output in synchronism with the clock signal. However, there arises such a problem that the capacity of the register increases with an increase in the resolution of phase. In this example, a technique of the control pattern generation circuit 31 without using the register will be described.

The control pattern generation circuit 31 shown in FIG. 19 includes a fractional control circuit 43 and a reset circuit 45. The reset circuit 45 receives θ in synchronism with the clock signal as an input to output a reset signal (RST) to the fractional control circuit 43 at a timing corresponding to θ. The fractional control circuit 43 receives RST and θ as inputs, and outputs p(t) to the synthetic circuit 32 in synchronism with the output signal $D_v(t)$ of the variable frequency divider 5 at the timing of RST.

Figure 20A:
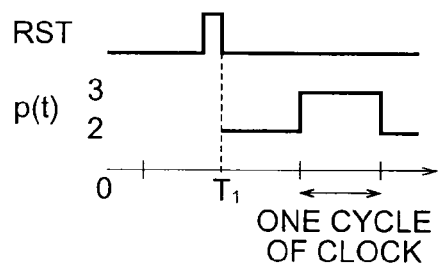
FIG. 20 Timing charts showing a relationship between a reset signal (RST) and p(t) of the frequency/phase control circuit according to the tenth embodiment of the present invention.
Figure 20B:
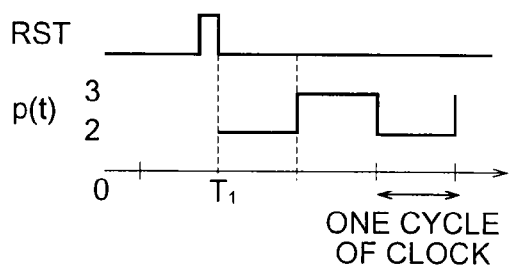

FIG. 20 show relationship between a reset signal (RST) and p(t). FIG. 20(*a*) shows a case in which p(t) at a time $T_1$ is 2, and FIG. 20(*b*) shows a case in which p(t) at a time $T_1$ is 3. In this example, it is assumed that the fractional control circuit 43 that has been reset repeats 2 and 3 such as 2, 3, 2, 3, . . . as a pattern. When p(t) starts from 2 at the time $T_1$, RST is input to the fractional control circuit 43 at a timing of $T_1$. On the other hand, when p(t) starts from 3 at the time $T_1$, RST is input to the fractional control circuit 43 earlier by one clock with respect to $T_1$. 2 is output as p(t) at a time earlier than $T_1$ by one clock. As a result, p(t) becomes 3 at the time $T_1$. As described above, the timing of resetting the fractional control circuit is changed, thereby making it possible to control p(t) that is output from the fractional control circuit without using the register.

Eleventh Embodiment

Figure 21:
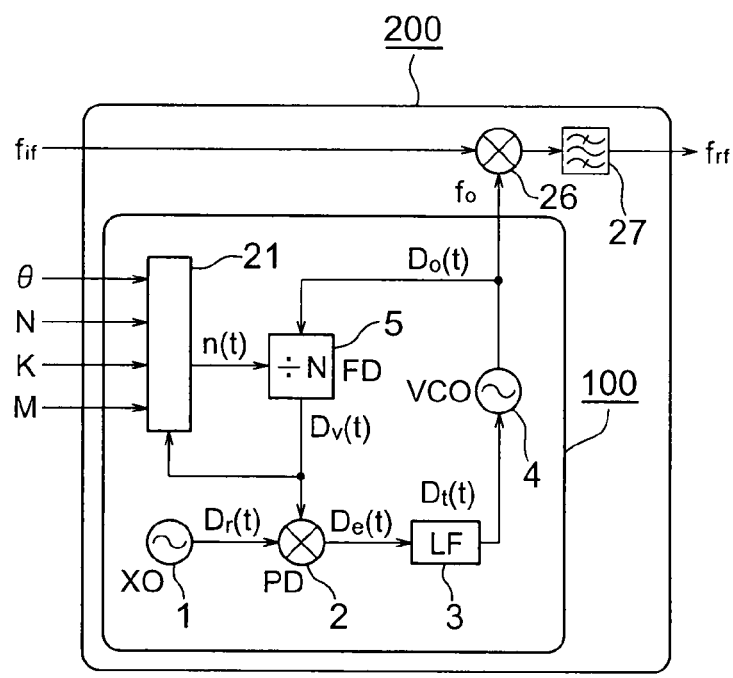
FIG. 21 A diagram showing the configuration of a phase shift circuit with a frequency converting function according to an eleventh embodiment of the present invention.
Figure 22:
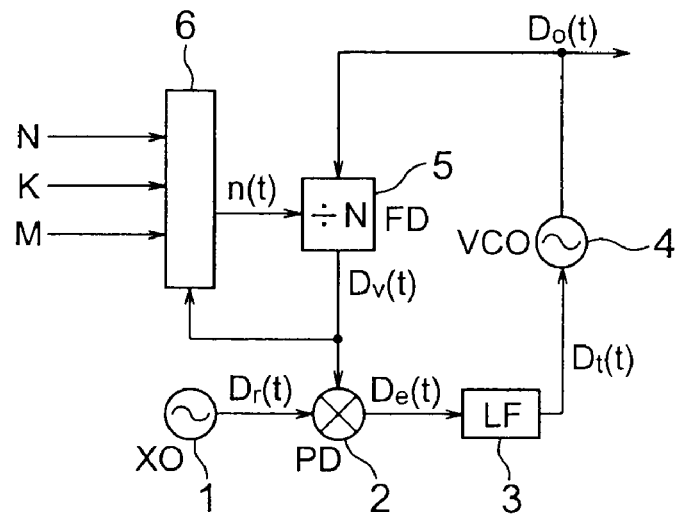
FIG. 22 A diagram showing the configuration of a conventional F-PLL synthesizer.

A description will be given of a phase shift circuit with a frequency converting function according to an eleventh embodiment of the present invention with reference to FIG. 21. FIG. 21 is a diagram showing the configuration of the phase shift circuit with a frequency converting function according to the eleventh embodiment of the present invention.

Referring to FIG. 21, a phase shift circuit 200 with a frequency converting function according to the eleventh embodiment is made up of an F-PLL synthesizer 100, a frequency conversion circuit 26, and a band pass filter 27.

In the eleventh embodiment, a description will be given of a technique of realizing the phase shift circuit 200 with a frequency converting function by the aid of the F-PLL synthesizer 100 described in the above first to tenth embodiments.

As described above, the phase shift circuit 200 with a frequency converting function shown in FIG. 21 is made up of the F-PLL synthesizer 100, the frequency conversion circuit 26, and the band pass filter 27. The F-PLL synthesizer 100 receives the setting data (N, K, M, θ) from the external as an input to output the output signal (frequency $f_o$) to an LO terminal of the frequency conversion circuit 26.

The frequency conversion circuit 26 receives the signal (frequency $f_{if}$) from the external and the signal (frequency $f_o$) from the F-PLL synthesizer 100 as inputs to output the frequency mixed signal to the band pass filter 27. The band pass filter 27 receives the output signal of the frequency conversion circuit 26 as an input, suppresses the unnecessary frequency component, and outputs the desired frequency component to the external.

The input signal $D_{if}(t)$ of the phase shift circuit 200 with a frequency converting function and the output signal $D_o(t)$ of the F-PLL synthesizer 100 are represented by the following Expressions (10) and (11).

$$D_{if}(t)=\sin(2\pi f_{if}t+\theta_{if}) \quad (10)$$

$$D_o(t)=\sin(2\pi f_o t+\theta_o) \quad (11)$$

where $\theta_{if}$ is an initial phase of $D_{if}(t)$, and $\theta_o$ is a phase of $D_o(t)$.

Through Expressions (10) and (11), the output signal $D_{mix}(t)$ of the frequency conversion circuit 26 is represented by the following Expression (12). In this example, it is assumed that the frequency conversion circuit 26 is an ideal multiplexer.

$$D_{mix}(t)=D_{if}(t)\cdot D_o(t)=\sin(2\pi f_{if}t+\theta_{if})\cdot\sin(2\pi f_o t+\theta_o)=0.5\cdot(\cos(2\pi f_o t+\theta_o-2\pi f_{if}t-\theta_{if})-\cos(2\pi f_o t+\theta_o+2\pi f_{if}t+\theta_{if})) \quad (12)$$

In this example, the pass frequency of the band pass filter 27 is an upper side band. Through Expression (12), the output signal $D_{rf}(t)$ of the phase shift circuit 200 with a frequency converting function is represented by the following Expression (13). In this example, it is assumed that the frequency conversion circuit 26 is an ideal multiplexer.

$$D_{if}(t)=-\cos(2\pi f_o t+\theta_o+2\pi f_{if}t)+\theta_{if}=-\cos(2\pi f_{rf}t+\theta_{rf}) \quad (13)$$

As represented by Expression (13), with the use of the phase shift circuit 200 with a frequency converting function, the frequency of the input signal can be converted from $f_{if}$ to $f_{rf}(=f_o+f_{if})$, and the phase can be converted from $\theta_{if}$ to $\theta_{rf}(=\theta_o+\theta_{if})$.

The invention claimed is:

1. A phase-locked loop frequency synthesizer of a fractional N-type, comprising:
    a reference oscillator that generates a reference signal;
    a voltage controlled oscillator that generates a single high frequency signal;
    a variable frequency divider that divides the high frequency signal in frequency to output a feedback signal;
    a phase comparator that compares the reference signal and the feedback signal with each other to output a phase comparison signal;
    a loop filter that outputs a control signal of the voltage controlled oscillator based on the phase comparison signal; and
    a frequency/phase control circuit that generates frequency division number control data in synchronism with any one of the feedback signal and the reference signal based on first setting data and second setting data that are input from an external source to output the frequency division number control data to the variable frequency divider, wherein at least one of the first and second setting data includes phase control data.

2. The phase-locked loop frequency synthesizer of a fractional N-type according to claim 1, wherein the frequency/phase control circuit comprises:
    a memory that outputs a given pattern corresponding to an address with the first setting data and the second setting data as the address; and
    a register that generates the frequency division number control data in synchronism with any one of the feedback signal and the reference signal based on the given pattern to output the frequency division number control data to the variable frequency divider.

3. The phase-locked loop frequency synthesizer of a fractional N-type according to claim 1, wherein the frequency/phase control circuit comprises:
    a memory that outputs a given pattern corresponding to an address with the first setting data as the address;
    a phase calculation circuit that outputs frequency division number control data corresponding to the second setting data based on the second setting data and the given pattern; and
    a register that generates the frequency division number control data in synchronism with any one of the feedback signal and the reference signal based on an output of the phase calculation circuit to output the frequency division number control data to the variable frequency divider.

4. The phase-locked loop frequency synthesizer of a fractional N-type according to claim 1, wherein the frequency/phase control circuit comprises:
    a fractional control circuit that outputs a given pattern corresponding to an address with the first setting data as the address;
    a phase calculation circuit that outputs frequency division number control data corresponding to the second setting data based on the second setting data and the given pattern; and
    a register that generates the frequency division number control data in synchronism with any one of the feedback signal and the reference signal based on an output of the phase calculation circuit to output the frequency division number control data to the variable frequency divider.

5. The phase-locked loop frequency synthesizer of a fractional N-type according to claim 1, wherein the frequency/phase control circuit comprises:
    a reset circuit that outputs a reset signal based on the second setting data at a timing corresponding to the second setting data; and
    a fractional control circuit that generates frequency division number control data based on the reset signal and the first setting data according to the timing of the reset signal to output the frequency division number control data to the variable frequency divider.

6. The phase-locked loop frequency synthesizer of a fractional N-type according to claim 1, wherein the frequency division number control data of the variable frequency divider is different from the second setting data in data pattern.

7. The phase-locked loop frequency synthesizer of a fractional N-type according to claim 1, wherein the frequency/phase control circuit comprises:
    a first fractional control circuit that generates a first control pattern in synchronism with any one of the feedback signal and the reference signal based on the first setting data;
    a control pattern generation circuit that generates a second control pattern in synchronism with any one of the feedback signal and the reference signal based on the second setting data; and
    a synthetic circuit that outputs a control pattern obtained by synthesizing the first control pattern and the second control pattern to the variable frequency divider.

8. The phase-locked loop frequency synthesizer of a fractional N-type according to claim 7, wherein the control pattern generation circuit comprises:
    a memory that outputs a given control pattern corresponding to an address with the second setting data as the address; and a register that outputs the second control pattern to the synthetic circuit in synchronism with any one of the feedback signal and the reference signal based on the given control pattern.

9. The phase-locked loop frequency synthesizer of a fractional N-type according to claim 7, wherein the control pattern generation circuit comprises:
a second fractional control circuit that outputs a given control pattern based on the second setting data;
a phase calculation circuit that generates the second control pattern based on the second setting data and the given control pattern; and
a register that outputs the second control pattern to the synthetic circuit in synchronism with any one of the feedback signal and the reference signal based on an output of the phase calculation circuit.

10. The phase-locked loop frequency synthesizer of a fractional N-type according to claim 7, wherein the control pattern generation circuit comprises:
a reset circuit that outputs a reset signal based on the second setting data at a timing corresponding to the second setting data; and
a second fractional control circuit that outputs the second control pattern to the synthetic circuit in synchronism with any one of the feedback signal and the reference signal based on the second setting data and the reset signal.

11. The phase-locked loop frequency synthesizer of a fractional N-type according to claim 1, wherein the frequency/phase control circuit comprises:
a frequency correction circuit that outputs third setting data that gives an output frequency based on the first setting data and the second setting data;
a first fractional control circuit that generates a first control pattern in synchronism with any one of the feedback signal and the reference signal based on the third setting data;
a control pattern generation circuit that generates a second control pattern in synchronism with any one of the feedback signal and the reference signal based on the second setting data; and
a synthetic circuit that outputs a control pattern obtained by synthesizing the first control pattern and the second control pattern to the variable frequency divider.

12. The phase-locked loop frequency synthesizer of a fractional N-type according to claim 1, further comprising a frequency synthesizer that changes a frequency of the reference signal instead of the reference oscillator.

13. A phase shift circuit with a frequency converting function, comprising:
the phase-locked loop frequency synthesizer of a fractional N-type according to claim 1;
a frequency conversion circuit that mixes an output signal of the phase-locked loop frequency synthesizer of a fractional N-type and an input signal from an external source in frequency to output a frequency mixture signal; and
a filter that suppresses an unnecessary frequency component from the frequency mixture signal to output a desired frequency component.

14. A phase-locked loop frequency synthesizer of a fractional N-type, comprising:
a reference oscillator that generates a reference signal;
a voltage controlled oscillator that generates a high frequency signal;
a variable frequency divider that divides the high frequency signal in frequency to output a feedback signal;
a phase comparator that compares the reference signal and the feedback signal with each other to output a phase comparison signal;
a loop filter that outputs a control signal of the voltage controlled oscillator based on the phase comparison signal; and
a frequency/phase control circuit that generates frequency division number control data in synchronism with any one of the feedback signal and the reference signal based on first setting data and second setting data that are input from an external source to output the frequency division number control data to the variable frequency divider, the frequency/phase control circuit including:
a reset circuit that outputs a reset signal based on the second setting data at a timing corresponding to the second setting data, and
a fractional control circuit that generates frequency division number control data based on the reset signal and the first setting data according to the timing of the reset signal to output the frequency division number control data to the variable frequency divider.

15. A phase-locked loop frequency synthesizer of a fractional N-type, comprising:
a reference oscillator that generates a reference signal;
a voltage controlled oscillator that generates a high frequency signal;
a variable frequency divider that divides the high frequency signal in frequency to output a feedback signal;
a phase comparator that compares the reference signal and the feedback signal with each other to output a phase comparison signal;
a loop filter that outputs a control signal of the voltage controlled oscillator based on the phase comparison signal; and
a frequency/phase control circuit that generates frequency division number control data in synchronism with any one of the feedback signal and the reference signal based on first setting data and second setting data that are input from an external source to output the frequency division number control data to the variable frequency divider, the frequency/phase control circuit including:
a first fractional control circuit that generates a first control pattern in synchronism with any one of the feedback signal and the reference signal based on the first setting data,
a control pattern generation circuit that generates a second control pattern in synchronism with any one of the feedback signal and the reference signal based on the second setting data, and
a synthetic circuit that outputs a control pattern obtained by synthesizing the first control pattern and the second control pattern to the variable frequency divider.

16. The phase-locked loop frequency synthesizer of a fractional N-type according to claim 15, wherein the control pattern generation circuit comprises:
a memory that outputs a given control pattern corresponding to an address with the second setting data as the address; and
a register that outputs the second control pattern to the synthetic circuit in synchronism with any one of the feedback signal and the reference signal based on the given control pattern.

17. The phase-locked loop frequency synthesizer of a fractional N-type according to claim 15, wherein the control pattern generation circuit comprises:
a second fractional control circuit that outputs a given control pattern based on the second setting data;

a phase calculation circuit that outputs the second control pattern based on the second setting data and the given control pattern; and a register that outputs the second control pattern to the synthetic circuit in synchronism with any one of the feedback signal and the reference signal based on an output of the phase calculation circuit.

18. The phase-locked loop frequency synthesizer of a fractional N-type according to claim 15, wherein the control pattern generation circuit comprises:

a reset circuit that outputs a reset signal based on the second setting data at a timing corresponding to the second setting data; and a second fractional control circuit that outputs the second control pattern to the synthetic circuit in synchronism with any one of the feedback signal and the reference signal based on the second setting data and the reset signal.

19. A phase-locked loop frequency synthesizer of a fractional N-type, comprising:

a reference oscillator that generates a reference signal;

a voltage controlled oscillator that generates a high frequency signal;

a variable frequency divider that divides the high frequency signal in frequency to output a feedback signal;

a phase comparator that compares the reference signal and the feedback signal with each other to output a phase comparison signal;

a loop filter that outputs a control signal of the voltage controlled oscillator based on the phase comparison signal; and a frequency/phase control circuit that generates frequency division number control data in synchronism with any one of the feedback signal and the reference signal based on first setting data and second setting data that are input from an external source to output the frequency division number control data to the variable frequency divider, the frequency/phase control circuit including:

a frequency correction circuit that outputs third setting data that gives an output frequency based on the first setting data and the second setting data, a first fractional control circuit that generates a first control pattern in synchronism with any one of the feedback signal and the reference signal based on the third setting data, a control pattern generation circuit that generates a second control pattern in synchronism with any one of the feedback signal and the reference signal based on the second setting data, and a synthetic circuit that outputs a control pattern obtained by synthesizing the first control pattern and the second control pattern to the variable frequency divider.

20. A phase-locked loop frequency synthesizer of a fractional N-type, comprising:

a reference oscillator that generates a reference signal;

a voltage controlled oscillator that generates a high frequency signal;

a variable frequency divider that divides the high frequency signal in frequency to output a feedback signal;

a phase comparator that compares the reference signal and the feedback signal with each other to output a phase comparison signal;

a loop filter that outputs a control signal of the voltage controlled oscillator based on the phase comparison signal; and a frequency/phase control circuit that generates frequency division number control data in synchronism with any one of the feedback signal and the reference signal based on first setting data and second setting data that are input from an external source to output the frequency division number control data to the variable frequency divider, wherein at least one of the first and second setting data includes phase control data and the frequency/phase control circuit includes:

a memory that outputs a given pattern corresponding to an address with the first setting data as the address, a phase calculation circuit that outputs frequency division number control data corresponding to the second setting data based on the second setting data and the given pattern, and a register that generates the frequency division number control data in synchronism with any one of the feedback signal and the reference signal based on an output of the phase calculation circuit to output the frequency division number control data to the variable frequency divider.

21. A phase-locked loop frequency synthesizer of a fractional N-type, comprising:

a reference oscillator that generates a reference signal;

a voltage controlled oscillator that generates a high frequency signal;

a variable frequency divider that divides the high frequency signal in frequency to output a feedback signal;

a phase comparator that compares the reference signal and the feedback signal with each other to output a phase comparison signal;

a loop filter that outputs a control signal of the voltage controlled oscillator based on the phase comparison signal; and a frequency/phase control circuit that generates frequency division number control data in synchronism with any one of the feedback signal and the reference signal based on first setting data and second setting data that are input from an external source to output the frequency division number control data to the variable frequency divider, wherein at least one of the first and second setting data includes phase control data and the frequency/phase control circuit includes:

a fractional control circuit that outputs a given pattern corresponding to an address with the first setting data as the address, a phase calculation circuit that outputs frequency division number control data corresponding to the second setting data based on the second setting data and the given pattern, and a register that generates the frequency division number control data in synchronism with any one of the feedback signal and the reference signal based on an output of the phase calculation circuit to output the frequency division number control data to the variable frequency divider.

* * * * *